(12) United States Patent
Gerstmayr et al.

(10) Patent No.: US 11,617,278 B2
(45) Date of Patent: Mar. 28, 2023

(54) HOUSEHOLD APPLIANCE

(71) Applicant: BSH HAUSGERAETE GMBH, Munich (DE)

(72) Inventors: Florian Gerstmayr, Gundelfingen (DE); Roland Kuemmel, Nellingen (DE); Xiaofei Wu, Nanjing (CN)

(73) Assignee: BSH Hausgeraete GmbH, Munich (DE)

(*) Notice: Subject to any disclaimer, the term of this patent is extended or adjusted under 35 U.S.C. 154(b) by 499 days.

(21) Appl. No.: 16/819,396

(22) Filed: Mar. 16, 2020

(65) Prior Publication Data

US 2020/0296851 A1 Sep. 17, 2020
US 2021/0136943 A9 May 6, 2021

(30) Foreign Application Priority Data

Mar. 14, 2019 (CN) .......................... 201910192908.X

(51) Int. Cl.
*H05K 5/03* (2006.01)
*H05K 5/06* (2006.01)
*H05K 5/02* (2006.01)

(52) U.S. Cl.
CPC ........... *H05K 5/061* (2013.01); *H05K 5/0221* (2013.01)

(58) Field of Classification Search
CPC ........ H05K 5/0221; H05K 5/06; H05K 5/061; F25D 2400/361
See application file for complete search history.

(56) References Cited

U.S. PATENT DOCUMENTS

| | | | | |
|---|---|---|---|---|
| 8,424,927 B2* | 4/2013 | Tsai | ...................... | F16B 5/0664 292/87 |
| 2004/0194253 A1* | 10/2004 | Jung | ....................... | F25D 23/02 16/87.2 |
| 2011/0048047 A1* | 3/2011 | Kim | ...................... | F25D 23/028 29/890.035 |
| 2014/0145579 A1* | 5/2014 | Anderson | ............. | F25D 29/005 29/428 |
| 2015/0035416 A1* | 2/2015 | Yang | .................... | H05K 5/0013 312/223.1 |
| 2017/0370636 A1* | 12/2017 | Koo | ......................... | F25D 23/02 |

FOREIGN PATENT DOCUMENTS

CN  108139140 A  6/2018
WO  2017060065 A1  4/2017

* cited by examiner

*Primary Examiner* — Matthew W Ing
(74) *Attorney, Agent, or Firm* — Laurence A. Greenberg; Werner H. Stemer; Ralph E. Locher

(57) ABSTRACT

A household appliance includes a housing having an accommodating cavity. The accommodating cavity has an installation opening. An electrical appliance is adapted to enter the accommodating cavity through the installation opening. A cover is configured to seal the accommodating cavity. The housing has a disassembling hole adapted to receive an insertion of a tool configured to disassemble the cover from the housing. The disassembling hole is in communication with the accommodating cavity and an entrance of the disassembling hole is located outside the installation opening.

17 Claims, 5 Drawing Sheets

HOUSEHOLD APPLIANCE

CROSS-REFERENCE TO RELATED APPLICATION

This application claims the priority, under 35 U.S.C. § 119, of Chinese Patent Application CN 201910192908, filed Mar. 14, 2019; the prior application is herewith incorporated by reference in its entirety.

BACKGROUND OF THE INVENTION

Field of the Invention

Embodiments of the present invention relate to a household appliance, for example, a cooling appliance.

Chinese Patent Application CN 108139140 A, corresponding to International Publication WO 2017/060065 A1, discloses a cover part, which is configured as a cover for covering a shaft of a household appliance, and includes a cover plate and a locking element which is configured to lock a component of the household appliance and is integrated on the cover plate, in which the locking element includes an engagement channel that is open on the cover plate, the engagement channel is configured to engage control elements, and the engagement channel is accessible through a continuous hole in the cover plate.

SUMMARY OF THE INVENTION

It is accordingly an object of the invention to provide a household appliance, which overcomes the hereinaforementioned disadvantages of the heretofore-known appliances of this general type and which has a cover that is easy to be disassembled.

With the foregoing and other objects in view there is provided, in accordance with the invention, a household appliance. The household appliance includes a housing. The housing includes an accommodating cavity. The accommodating cavity includes an installation opening and a cover configured to close the accommodating cavity. The housing includes a disassembling hole (or disassembling opening or disassembling channel) adapted to receive an insertion of a tool configured to disassemble the cover from the housing, the disassembling hole is in communication with the accommodating cavity, and an entrance (in particular an entrance being exposed to the surroundings and/or being accessible by the tool) of the disassembling hole is located outside the installation opening.

Since a disassembling tool does not need to be inserted into the disassembling hole through the installation opening, it is possible for an appearance of the cover to become more complete.

The household appliance in the embodiments of the present invention may be a cooling appliance, a sterilizing cabinet, a dishwasher, a washing machine, or the like. In an embodiment in which the housing includes a door and a main body, the accommodating cavity may be provided in the door or in the main body.

In one or more embodiments, an electrical appliance is included, and the electrical appliance is adapted to enter the accommodating cavity through the installation opening. The electrical appliance includes a device or a module that consumes electricity. The electrical appliance may include a bearing or carrying element configured to bear or carry an electronic device. The electrical appliance may, for example, be a display and/or operation module, an illumination module, a sensor, or the like.

In one or more embodiments, the housing includes a first surface and a second surface intersecting with each other, the installation opening is located on the first surface, and the entrance of the disassembling hole is located on the second surface. Therefore, it is possible to hide the entrance of the disassembling hole when necessary.

In one or more embodiments, the disassembling hole extends along a direction substantially perpendicular to a depth direction of the accommodating cavity.

In one or more embodiments, the disassembling hole extends along a direction substantially parallel to the installation opening.

In one or more embodiments, the disassembling hole includes a first section configured to receive a head portion of the tool and a second section located outside the accommodating cavity, and along a depth direction of the accommodating cavity, and a height of the first section is less than a height of the second section, to adapt the tool to rotate around the head portion in the first section.

In one or more embodiments, a snap-fit connection mechanism located in the accommodating cavity is included, the housing and the cover are connected by the snap-fit connection mechanism, and the tool is adapted to be inserted into the disassembling hole to act on the snap-fit connection mechanism.

In one or more embodiments, the snap-fit connection mechanism includes at least one pair of locking portions overlapping each other along a depth direction of the accommodating cavity, and the disassembling tool is adapted to push the cover along the disassembling hole to reduce an overlap degree of the at least one pair of locking portions.

In one or more embodiments, the snap-fit connection mechanism includes a locking portion located on the cover, and at least a part of the locking portion and the disassembling hole are located in the same cross section.

In one or more embodiments, the accommodating cavity includes a bottom wall facing toward the installation opening and a side wall connected to the bottom wall, and the disassembling hole passes through the side wall.

In one or more embodiments, the side wall of the accommodating cavity includes a stepped portion, the cover includes a connection edge on the stepped portion, and the disassembling hole includes a first section located between the connection edge and the stepped portion.

In one or more embodiments, the stepped portion includes a recess depressed toward a depth direction of the accommodating cavity, and the first section of the disassembling hole includes the recess.

In one or more embodiments, the accommodating cavity includes a first cavity and a second cavity sequentially disposed along a depth direction of the accommodating cavity, the cover includes at least one pair of connection edges disposed opposite to each other and a locking portion located between the at least one pair of connection edges, the first cavity includes a step surface configured to support the connection edge, and the locking portion extends into the second cavity and is coupled to the housing by snap-fit connection.

In one or more embodiments, a sealing member is located in the accommodating cavity, the electrical appliance is located within a perimeter enclosed by the sealing member, and the disassembling hole is located outside the perimeter enclosed by the sealing member, in particular when looking vertically at the installation opening.

In one or more embodiments, the housing includes a main body of a storage compartment and a door configured to close the storage compartment, and the accommodating cavity is located in the door.

In one or more embodiments, the accommodating cavity is located in a side portion of the door, the entrance of the disassembling hole is located on a rear side of the door; or the accommodating cavity is located on a front side of the door, and the entrance of the disassembling hole is located in the side portion of the door. The side portion of the door may be a top side, a bottom side, a left side, or a right side of the door.

In one or more embodiments, a door gasket disposed on a rear side of the door is included, and the entrance of the disassembling hole is located on the rear side of the door and is located outside the door gasket, in particular outside a perimeter enclosed by the door gasket when looking vertically at the rear side of the door.

In one or more embodiments, the door includes a front panel, a rear panel, and an end cover connecting the front panel and the real panel, the accommodating cavity is located in the end cover, and the entrance of the disassembling hole is located on a rear surface of the end cover. In an embodiment, the end cover may include an edge bar configured to support the door gasket, and the entrance of the disassembling hole is located at the edge bar.

In one or more embodiments, the cover includes a panel and a connection frame, the connection frame is adhered to an inner side of the panel, and the connection frame and the housing are coupled by snap-fit connection.

In one or more embodiments, the connection frame includes a fixing mechanism configured to fix the electrical appliance in place.

In one or more embodiments, the connection frame includes a through hole, and the electrical appliance passes through the through hole and is connected to the inner side of the panel.

Other features which are considered as characteristic for the invention are set forth in the appended claims.

Although the invention is illustrated and described herein as embodied in a household appliance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
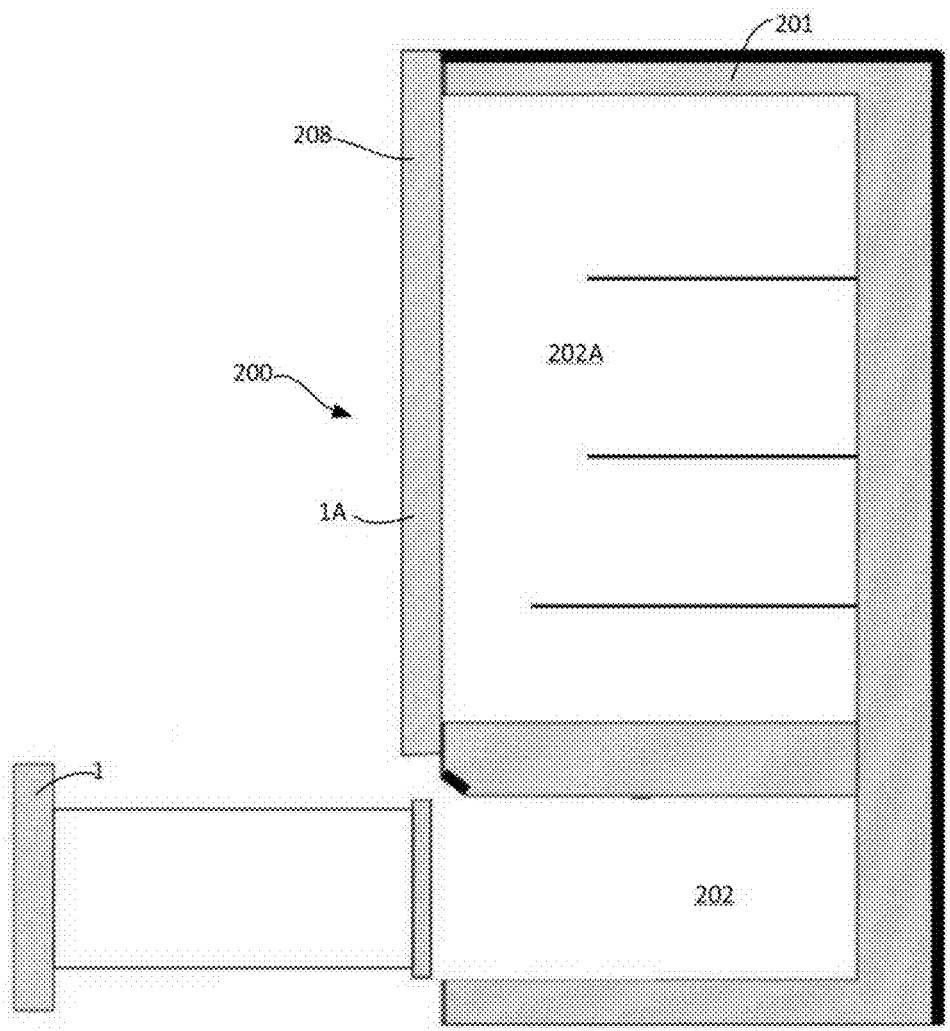
FIG. 1 is a diagrammatic, vertical-sectional view of a household appliance according to an embodiment of the present invention.

Referring now to the figures of the drawings in detail and first, particularly, to FIG. 1 thereof, there is seen a diagrammatic, vertical-sectional view of a household appliance according to an embodiment of the present invention. As shown in FIG. 1, a housing 208 of a household appliance 200 may include a main body 201 and doors 1 and 1A located in front of the main body 201. The doors 1 and 1A may be configured to close corresponding cavities 202 and 202A located in the main body 201.

In an exemplary embodiment, the household appliance 200 is a cooling appliance including a storage compartment, and the door is configured to close a corresponding storage compartment. There are thermal insulation materials inside the main body 201 and the doors 1 and 1A to reduce thermal exchange between the cooled/refrigerated cavities 202 and 202 A and ambient air.

Figure 2:
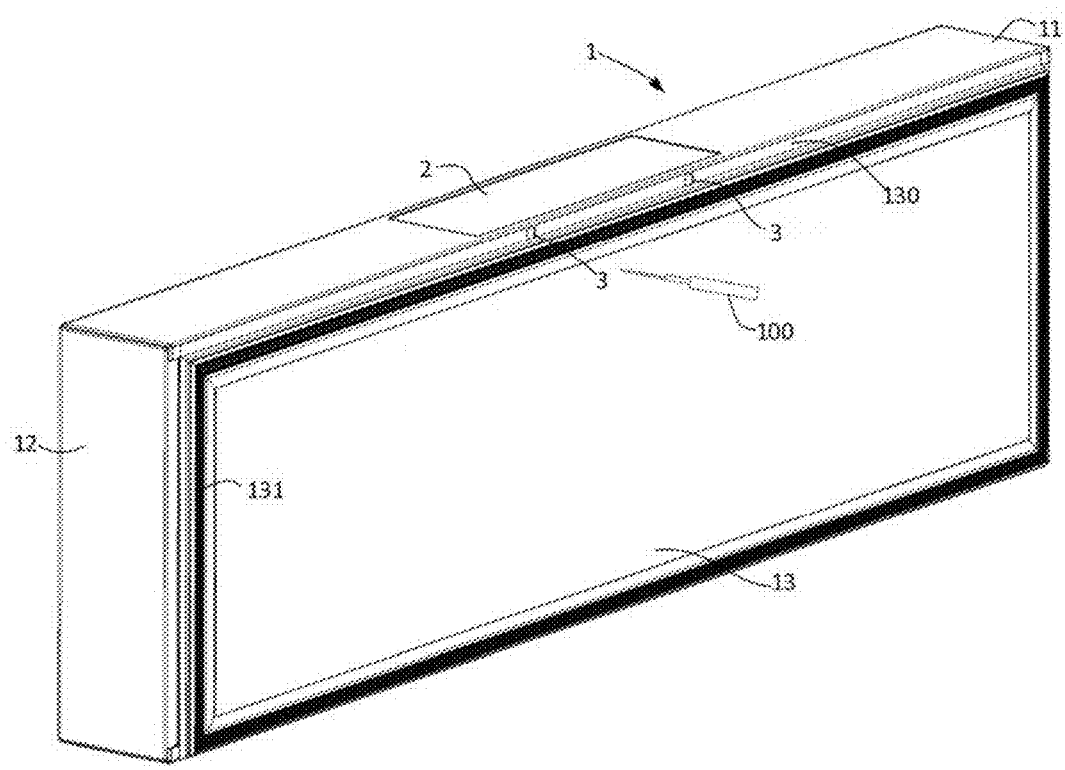
FIG. 2 is a perspective view of a door applied to a household appliance according to an embodiment of the present invention.
Figure 3:
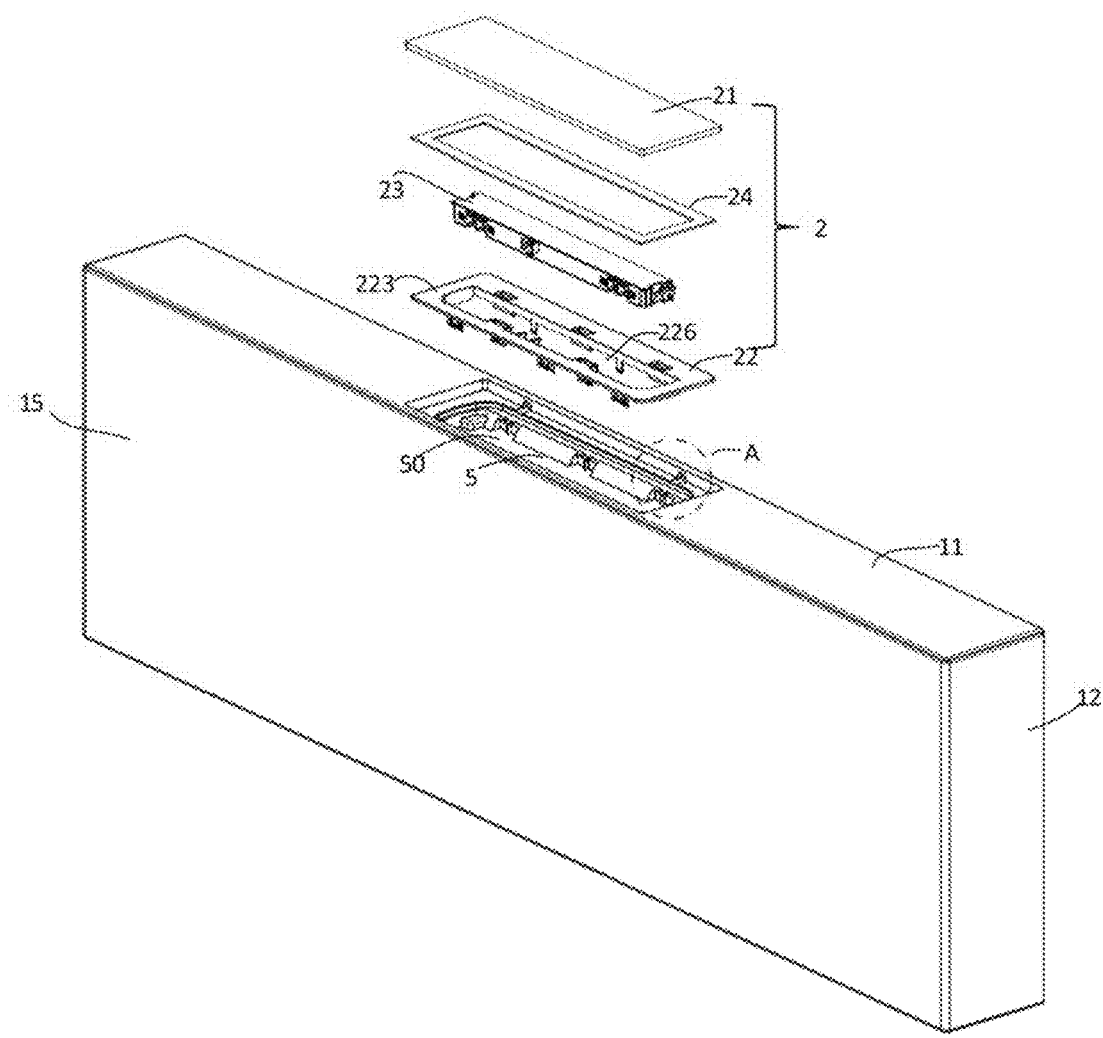
FIG. 3 is an exploded view of a door applied to a household appliance according to an embodiment of the present invention.

FIG. 2 is a diagrammatic perspective view of a door 1 applied to the household appliance 200 according to an embodiment of the present invention. FIG. 3 is a diagrammatic exploded view of a door applied to a household appliance according to an embodiment of the present invention. Referring to FIG. 2 and FIG. 3, the door 1 includes a front side 15 facing toward a user when the door 1 is closed, a top side 11, a pair of opposite side surfaces 12, and a rear side 13 facing toward the cavity 202 when the door 1 is closed. A door gasket 131 may be disposed on the rear side 13 of the door 1. When the door 1 is closed, the door gasket 131 is in contact with a front end of the main body 201 to prevent cool air from leaking through a gap between the door 1 and the main body 201.

The door 1 includes an accommodating cavity 5, and the accommodating cavity 5 includes an installation opening 50 to accommodate another device. In an exemplary embodiment, the household appliance 200 includes an electrical appliance 23 that consumes electricity, and the electrical appliance 23 is adapted to enter or exit the accommodating cavity 5 through the installation opening 50. The electrical appliance 23 may be at least partially located in the accommodating cavity 5.

The electrical appliance 23 may include at least one of a printed circuit board, a light source, a display device, and/or a touch device. In an exemplary embodiment, the electrical appliance 23 may be a display and/or operation module. For example, the electrical appliance 23 includes a display and/or touch device 231 (as shown in FIG. 6) in tight contact with an inner surface of the cover 2.

In an exemplary embodiment, the accommodating cavity 5 is located on the top side 11 of the door 1 and opening upward.

Figure 6:
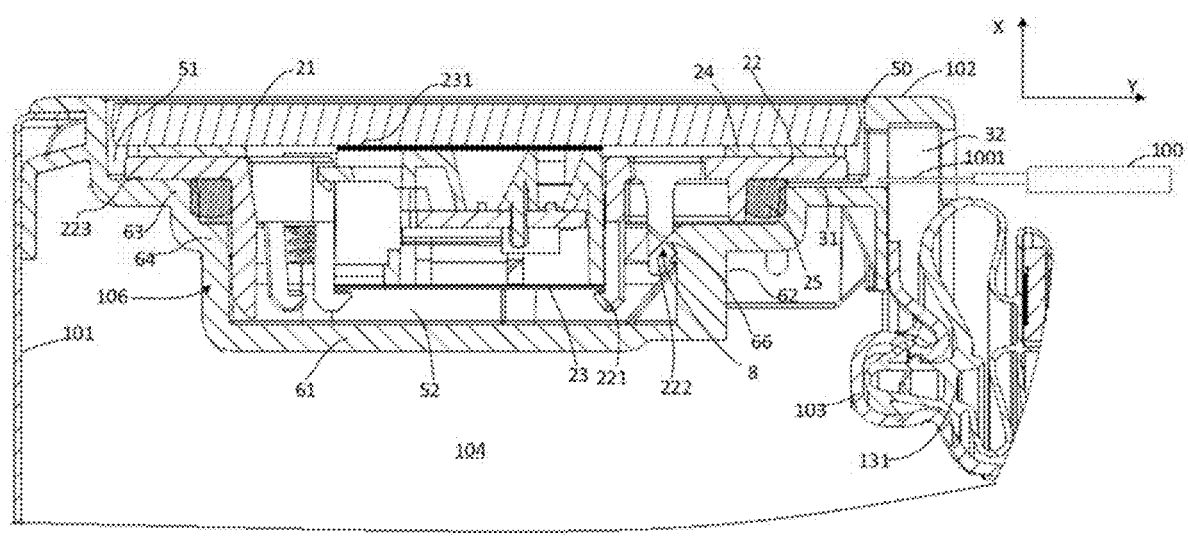
FIG. 6 is a fragmentary, exploded view of a door applied to a household appliance according to an embodiment of the present invention.

Referring to FIG. 6 in combination with FIG. 1 and FIG. 2, the door 1 may include a front panel 101, a rear panel 103 disposed at a predetermined distance from the front panel 101, and an end cover 102 located on a side of the door 1 to connect the front panel 101 and a corresponding end of the rear panel 103.

There is a thermal insulation space 104 between the front panel 101 and the rear panel 103. The thermal insulation space may be filled with a thermal insulation material. The thermal insulation material may be formed by foaming of a foaming liquid injected into the thermal insulation space 104 in a foaming process, and the thermal insulation material may be tightly combined with the end cover 102.

The accommodating cavity 5 may be located in the end cover 102. In an embodiment, the end cover 102 may include a concave portion 106 depressed toward the thermal insulation space 104, and the accommodating cavity 5 is located in the concave portion 106.

The end cover 102 may include an edge bar 130 extending downward from a rear end of a main body portion of the end cover 102. The edge bar 130 may be configured to support the door gasket 131 disposed on the rear side of the door 1.

The accommodating cavity 5 is sealed by the cover 2. The cover 2 may include a panel 21 matching the installation opening 50 and a connection structure located on an inner side of the panel 21. The cover 2 is fixed to the door 1 by the connection structure.

The connection structure of the cover 2 and the panel 21 may be integrally formed by a single component, or may be separately manufactured and then connected together.

A seal ring 25 may be disposed between the cover 2 and an inner wall of the accommodating cavity 5, and the electrical appliance 23 is located in the seal ring 25. The seal ring 25 is beneficial for preventing an external liquid from coming in contact with the electrical appliance 23.

A snap-fit connection mechanism 8 may be located in the accommodating cavity 5, and the cover 2 is connected to the door 1 through the snap-fit connection mechanism 8.

The snap-fit connection mechanism 8 may be configured to deform the seal ring 25 sufficiently to enhance sealing performance, thereby improving waterproof performance.

In an exemplary embodiment, a snap-fit connection strength of the snap-fit connection mechanism 8 is configured as follows: when a suction cup with a 200 N suction force is used to suction the cover 2, the snap-fit connection mechanism 8 cannot be detached. That is, the cover 2 still cannot be disassembled from the door 1.

In order to disassemble the cover 2 from the door 1, the door 1 includes a disassembling hole 3 adapted to receive insertion of a tool 100 configured to disassemble the cover 2 from the door 1. The disassembling hole 3 is in communication with the accommodating cavity 5. An entrance of the disassembling hole 3 is located outside the installation opening 50. That is, the tool 100 may be inserted into the disassembling hole 3 without passing through the installation opening 50.

In an embodiment, the installation opening 50 may be located on a first surface of the door 1, and the entrance of the disassembling hole 3 may be located on a second surface intersecting with the first surface. The tool 100 may be inserted into the disassembling hole 3 from another side that is different from the side including the installation opening 50.

In an exemplary embodiment, the installation opening 50 is located on the top side 11 of the door 1, and the entrance of the disassembling hole 3 is located on the rear side 13 of the door 1. As shown in FIG. 2, the entrance of the disassembling hole 3 may be located at the edge bar 130.

In another embodiment, when the accommodating cavity 5 is disposed close to the left/right side 12 of the door 1, the entrance of the disassembling hole 3 may be also located at the left/right side 12.

It can be easily understood that in still another embodiment, when the accommodating cavity is located on the front side of the door 1 and close to the top side, the bottom side, or the left/right side of the door, the entrance of the disassembling hole 3 may be also distributed on the top side, the bottom side, or the left/right side of the door that is close to the accommodating cavity.

As shown in FIG. 6, in an embodiment, the disassembling hole 3 may extend along a direction basically parallel to the installation opening 50. In an embodiment, the disassembling hole 3 may extend along a direction basically perpendicular to a depth direction X of the accommodating cavity 5.

The snap-fit connection mechanism 8 may include a plurality of pairs of locking portions 222 and 66 located in the accommodating cavity 5 and forming locking cooperation. The locking portion 222 is disposed on the cover 2, and the locking portion 66 may be disposed on the inner wall of the accommodating cavity 5. The locking portions 222 and 66 are coupled by a snap-fit connection along the depth direction X of the accommodating cavity 5 to prevent the cover 2 from being loosened.

The tool 100 may be adapted to apply a propulsive force along an extending direction Y of the disassembling hole 3 to the cover 2, to reduce the interference degree of the at least one pair of locking portions 222 and 66, so that the cover 2 is detachable. The tool 100 may directly or indirectly push the cover 2 to separate a pair of locking portions 222 and 66 that are engaged together.

At least a part of the at least one pair of locking portions 222 and 66 and the disassembling hole 3 may have the same cross section (as shown in FIG. 6), so that the force applied by the tool 100 to the cover 2 may act on the locking portions 222 and 66 more directly, to improve the disassembling effect.

Figure 5:
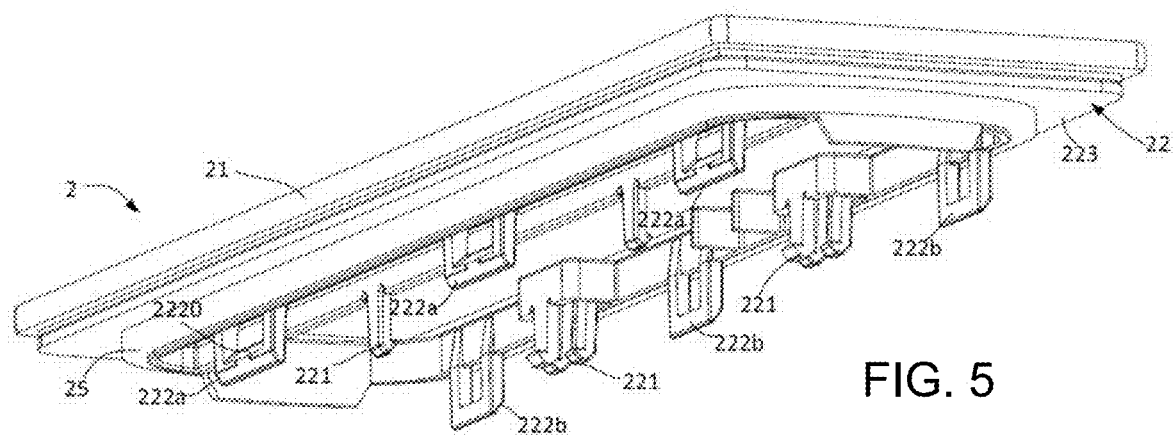
FIG. 5 is a perspective view of a cover configured to cover an accommodating cavity according to an embodiment of the present invention.

In an exemplary embodiment, the locking portion 222 may include a locking portion 222a on a side close to the disassembling hole 3 and a locking portion 222b located on a side opposite to the locking portion 222a. In an exemplary embodiment, as shown in FIG. 5, the locking portion 222a on a side close to the disassembling hole 3 may include a guiding slope 2220 with an inclination angle greater than that of the opposite locking portion 222b. The guiding slope 2220 is connected to the locking portion 66 located on the housing 208. This is beneficial for reducing a probability of breakage of the snap-fit connection mechanism 8, and reducing difficulty of disassembling. In an embodiment, an angle between the guiding slope 2220 and the panel 21 ranges from 35 degrees to 65 degrees, and for example, from 40 degrees to 45 degrees.

The accommodating cavity 5 includes a bottom wall 61 facing toward the installation opening 50 and a side wall 62 located between the installation opening 50 and the bottom wall 61 and connected to the bottom wall 61. The disassembling hole 3 may pass through the side wall 62 to be in communication with the accommodating cavity 5. Therefore, the tool 100 may pass through the side wall 62 of the accommodating cavity 5 to apply a force to a component located in the accommodating cavity 5.

In order to prevent an external liquid from coming into contact with the electrical appliance 23 through the disassembling hole 3, the disassembling hole 3 is located outside the seal ring 25. The tool 100 applies a force to the cover 2 outside the seal ring 25.

In an exemplary embodiment, the seal ring 25 may be exposed to the disassembling hole 3. The tool 100 extending into the disassembling hole 3 may apply a disassembling force to the cover 2 by pushing the seal ring 25. Alternatively, one end, relatively distant from the bottom wall 61, of the seal ring 25 is exposed to the disassembling hole 3.

As seen along the depth direction X of the accommodating cavity 5, the whole disassembling hole 3 may be closer to the installation opening 50 than the seal ring 25.

The side wall 62 may include a first stepped portion 63. The first stepped portion 63 is close to the installation opening 50, but there is a spacing between the first stepped portion 63 and the installation opening 50. Therefore, the accommodating cavity 5 includes a first cavity 51 and a second cavity 52 sequentially disposed along the depth direction X of the accommodating cavity 5. Sizes of the second cavity 52 are less than sizes of the first cavity 51 along a length direction and a width direction of the accommodating cavity 5.

As is shown in FIG. 3 to FIG. 6, the cover 2 may include a connection edge 223 on a step surface 631 of a first stepped portion 63. The locking portion 222 disposed on the cover 2 is located between two corresponding connection edges 223 and forms a locking cooperation in the second cavity 52 to fix the cover 2 to the door 1.

The disassembling hole 3 may include a first section 31 located in the accommodating cavity 5 to receive a head portion 1001 of the tool 100 and a second section 32 located outside the accommodating cavity 5. Along the depth direction of the accommodating cavity 5, a height of the first section 31 of the disassembling hole 3 is less than a height of the second section 32, so that the tool 100 is adapted to rotate around the head portion 1001 extending into the first section 31.

The first section 31 may be slit-shaped. The head portion 1001 of the tool 100 may be flat to extend into the first section 31.

The step surface 631 may include a recess 65 depressed along the depth direction of the accommodating cavity 5, to form the first section 31, located in the accommodating cavity 5, of the disassembling hole 3. The connection edge 223 defines a part of a boundary of the first section 31 of the disassembling hole 3. The tool 100 inserted into the first section 31 can directly act on the connection edge 223.

The tool 100, of which the head portion 1001 is inserted into the recess 65, may be rotated by using the head portion 1001 as a supporting point. In this way, in addition to applying a propulsive force to the cover 2, the tool 100 may also apply a force, that detaches the cover 2 from the accommodating cavity 5, to the connection edge 223, so that the cover 2 can be easily disassembled.

Figure 4:
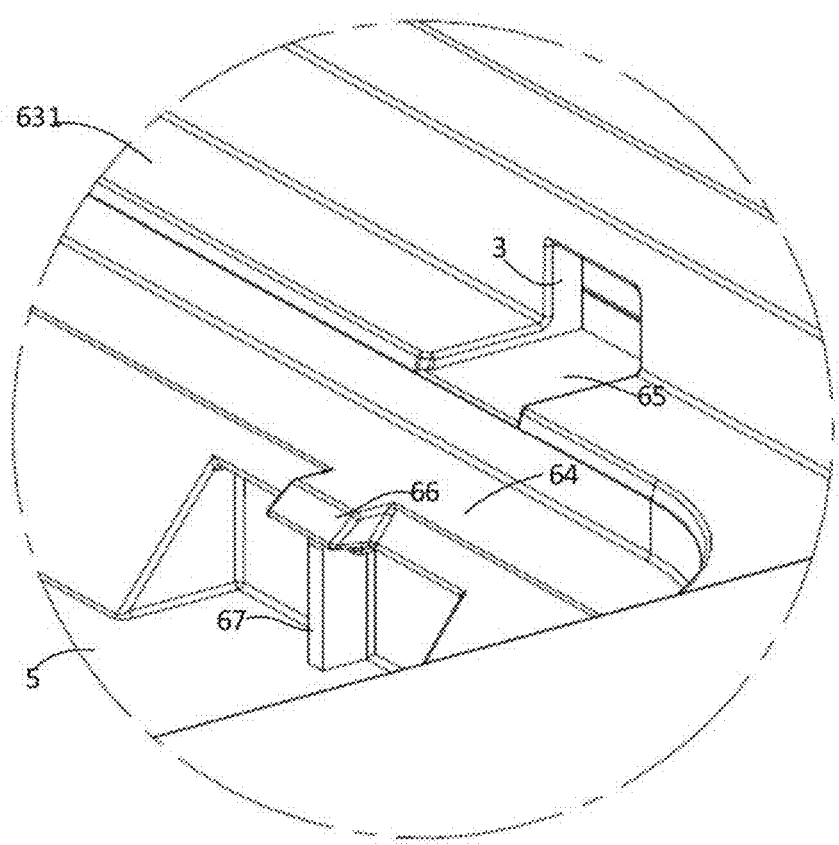
FIG. 4 is an enlarged view of a part A in FIG. 3.

As is shown in FIG. 4 and FIG. 6, the side wall 62 of the accommodating cavity may further include a second stepped portion 64. Along the depth direction of the accommodating cavity 5, the second stepped portion 64 is closer to the bottom wall 61 than the first stepped portion 63. The locking portion 222 disposed on the cover 2 and the locking portion 66 located on the second stepped portion 64 are coupled by a snap-fit connection.

The side wall 62 may be provided with a reinforcing rib 67 configured to reinforce the strength of the locking portion 66, to prevent breakage of the locking portion 66 during disassembling.

As is shown in FIG. 3, in an exemplary embodiment, the cover 2 includes the panel 21 and a connection frame 22 configured to connect to a corresponding mechanism in the accommodating cavity 5.

The cover 2 is connected to the door 1 by the connection frame 22 in the manner of a snap-fit. The connection frame 22 may include a plurality of locking portions 222 distributed in a spaced manner. The accommodating cavity 5 is provided with a plurality of the adaptive cooperative locking portions 66. The locking portion 222 and the cooperative locking portion 66 are locked to fix the cover 2 to the door 1.

The connection frame 22 may include a fixing mechanism configured to fix the electrical appliance 23. The electrical appliance 23 may serve as a module and be fixed to the fixing mechanism. For example, the electrical appliance may include a bearing or carrying mechanism configured to bear or carry one or more electronic devices.

The electrical appliance 23 may be fixed to the connection frame 22 as follows: at least one electronic device is in tight contact with the inner side of the panel 21. The fixing mechanism may be configured to apply a force toward the inner side of the panel 21 to the electrical appliance 23, so that the electrical appliance 23 maintains good contact with the inner side of the panel 21. This is particularly beneficial for an embodiment in which the electrical appliance 23 includes a touch device or a display device.

The fixing mechanism may include a plurality of fixing hooks 221 configured to fix the electrical appliance 23. The fixing hooks 221 enable the electrical appliance 23 to be fixed to the connection frame 22. The electrical appliance 23 may be detachably fixed to the connection frame 22.

At least most or a major part of the electrical appliance 23 may be located in a first frame enclosed by the fixing hooks 221. The fixing mechanism configured to fix the electrical appliance 23, for example the fixing hooks 221, may be located in a second frame enclosed by the locking portions 222. The whole electrical appliance 23 is located in the second frame enclosed by the locking portions 222.

The sealing ring or member 25 may be disposed between the cover 2 and the accommodating cavity 5. The sealing member 25 may be compressed and deformed between the cover 2 and the side wall 66 of the accommodating cavity 5, to prevent external liquid from coming into contact with the electrical appliance 23.

In an embodiment, the sealing member 25 may be a foam sealant or another sealing material.

The sealing member 25 may be located outside the second frame enclosed by the locking portions 222, thereby preventing the external liquid from entering the second frame enclosed by the locking portions 222. This is beneficial for reducing a probability of the external liquid coming into contact with the electronic devices in the accommodating cavity 5.

In an exemplary embodiment, the connection frame 22 and the panel 21 are separately manufactured and then assembled. For example, the panel 21 may be plate-shaped, and the inner side of the panel 21 may be basically flat. The panel 21 and the connection frame 22 may be made of different materials. For example, the panel 21 may be transparent or semi-transparent, and may be made of glass or plastic. The panel may also be likely to be made of ceramics or metal. The connection frame 22 may be made of plastic to form a connection mechanism.

As is shown in FIG. 3, the connection frame 22 may include a through hole 226, and one side, close to the panel 21, of the through hole 226 is open toward the inner side of the panel 21. The electrical appliance 23 may pass through the through hole 226 and protrude out of a surface facing toward the panel 21 of the through hole 226, to come in contact with the inner side of the panel 21. For example, the display and/or touch device 231 protrudes out of the surface facing toward the panel 21 of the through hole 226, to come in contact with the inner side of the panel 21.

The connection frame 22 may be fixed to the inner side of the panel 21 by an adhesion device 24. The adhesion device 24 may be a tape having a sealing effect, to enhance a waterproof effect.

The connection frame 22 may include the connection edge 223 extending outward from the through hole 226. The adhesion device 24 may be disposed between the panel 21 and a first side facing toward the panel 21 of the connection edge 223, to make the connection edge 223 adhere to the panel 21.

Each edge of the panel 21 may exceed the connection edge 223, to prevent the connection edge 223 and an inner surface of the accommodating cavity 5 from interfering with each other.

A lower surface of the connection edge 223 faces toward the step surface 631. The sealing member 25 is located between the connection edge 223 and the step surface 631.

In an embodiment, during assembly, the electrical appliance 23 is fixed to the connection frame 22, then the connection frame 22 is connected to the accommodating cavity 5. The connection frame 22 is fixed to the housing 208 through the snap-fit connection mechanism 8 located in the accommodating cavity 5. Then, the panel 21 is adhered to the connection frame 22 by the adhesion device 24 to seal the accommodating cavity 5. The electrical appliance 23 comes in contact with the inner side of the panel 21 to display information and/or receive user input.

In another embodiment, in step 1, the connection frame 22 and the panel 21 are connected by using the adhesion device 24. Then in step 2, an assembly member including the assembled panel 21 and the connection frame 22 is fixed to the accommodating cavity 5. The electrical appliance 23 may be fixed to the connection frame 22 before step 1 or may be fixed to the connection frame 22 after step 1 and before step 2 as required.

It can be easily understood that in an alternative embodiment, the cover may also be a one-piece structure. That is, the panel and the connection mechanism are integrally formed. For example, the locking portion 222 may directly extend inward from the inner side of the panel to connect to a corresponding structure in the accommodating cavity, and/or the fixing mechanism configured to fix the electrical appliance may also be integrally formed with the panel.

In an embodiment shown in the figure, the accommodating cavity 5 is located in a top portion of the door 1. It can be easily understood that in another embodiment, the accommodating cavity may alternatively be disposed on a front side or a side surface of the door 1, and the entrance of the disassembling hole may be located on a side different from the installation opening of the accommodating cavity.

It can be understood that the inventive concept disclosed by the exemplary embodiment in which the accommodating cavity is disposed in the door is also applied to a situation in which the accommodating cavity 5 is disposed in another part of the housing. For example, the inventive concept of the present invention is also applied to a situation in which the accommodating cavity is disposed in the main body. Details thereof are not described herein.

The invention claimed is:

1. A household appliance, comprising:
    a housing having an accommodating cavity, said accommodating cavity including an installation opening;
    a cover configured to close said accommodating cavity;
    said housing having a disassembling hole adapted to receive an insertion of a tool to disassemble said cover from said housing, said disassembling hole being in communication with said accommodating cavity, and said disassembling hole having an entrance located outside said installation opening;
    a snap-fit connection mechanism located in said accommodating cavity;
    said housing and said cover being connected to each other by said snap-fit connection mechanism;
    said disassembling hole adapted to receive an insertion of the tool to act on said snap-fit connection mechanism;
    said snap-fit connection mechanism including at least one pair of locking portions overlapping each other along a depth direction of said accommodating cavity; and
    said disassembling tool adapted to push said cover along a longitudinal direction of said disassembling hole to reduce an overlap degree of said at least one pair of locking portions.

2. The household appliance according to claim 1, wherein said housing includes first and second surfaces intersecting with each other, said installation opening is located on said first surface, and said entrance of said disassembling hole is located on said second surface.

3. The household appliance according to claim 1, wherein said disassembling hole extends along a direction substantially perpendicular to a depth direction of said accommodating cavity.

4. The household appliance according to claim 1, wherein said disassembling hole extends along a direction substantially parallel to said installation opening.

5. The household appliance according to claim 1, wherein:
    said disassembling hole includes a first section located in said accommodating cavity for receiving a head portion of the tool and a second section located outside said accommodating cavity and extending along a depth direction of said accommodating cavity;
    said first and second sections have heights, and said height of said first section is less than said height of said second section, permitting said tool to rotate around the head portion in said first section.

6. The household appliance according to claim 1, wherein said locking portions of said snap-fit connection mechanism include a locking portion located on said cover, and at least a part of said locking portion and said disassembling hole are located in an identical cross section.

7. The household appliance according to claim 1, wherein said accommodating cavity includes a bottom wall facing toward said installation opening and a side wall connected to said bottom wall, said disassembling hole penetrating through said side wall.

8. The household appliance according to claim 1, wherein:
    said accommodating cavity includes a first cavity and a second cavity sequentially disposed along a depth direction of said accommodating cavity;
    said cover includes at least one pair of connection edges disposed opposite to each other and a locking portion located between said at least one pair of connection edges;
    said first cavity includes a step surface configured to support said connection edges; and
    said locking portion extends into said second cavity and is coupled to said housing by a snap-fit connection.

9. The household appliance according to claim 1, which further comprises an electrical appliance adapted to enter said accommodating cavity through said installation opening.

10. The household appliance according to claim 9, which further comprises a sealing member located in said accommodating cavity, said electrical appliance being located within a perimeter enclosed by said sealing member, and said disassembling hole being located outside said perimeter enclosed by said sealing member.

11. The household appliance according to claim 1, wherein said housing includes a main body having a storage compartment and a door configured to close said storage compartment, said accommodating cavity being located in said door.

12. The household appliance according to claim 11, wherein:
   said door includes side portions, a rear side and a front side; and
      said accommodating cavity is located in one of said side portions and said entrance of said disassembling hole is located on said rear side, or
      said accommodating cavity is located on said front side and said entrance of said disassembling hole is located in one of said side portions.

13. The household appliance according to claim 11, which further comprises a door gasket disposed on a rear side of said door, said entrance of said disassembling hole being located on said rear side of said door and being located outside said door gasket.

14. The household appliance according to claim 11, wherein said door includes a front panel, a rear panel and an end cover interconnecting said front panel and said rear panel, said accommodating cavity being located in said end cover, and said entrance of said disassembling hole being located on a rear surface of said end cover.

15. A household appliance, comprising:
   a housing having an accommodating cavity, said accommodating cavity including an installation opening;
   a cover configured to close said accommodating cavity;
   said housing having a disassembling hole adapted to receive an insertion of a tool to disassemble said cover from said housing, said disassembling hole being in communication with said accommodating cavity, and said disassembling hole having an entrance located outside said installation opening;
   said accommodating cavity having a side wall including a stepped portion;
   said cover including a connection edge on said stepped portion; and
   said disassembling hole including a first section located between said connection edge and said stepped portion.

16. The household appliance according to claim 15, wherein said stepped portion has a recess depressed toward a depth direction of said accommodating cavity, and said first section of said disassembling hole includes said recess.

17. A household appliance, comprising:
   a housing having an accommodating cavity, said accommodating cavity including an installation opening;
   a cover configured to close said accommodating cavity;
   said housing having a disassembling hole adapted to receive an insertion of a tool to disassemble said cover from said housing, said disassembling hole being in communication with said accommodating cavity, and said disassembling hole having an entrance located outside said installation opening; and
   said cover including a panel and a connection frame, said connection frame being adhered to an inner side of said panel, and said connection frame and said housing being coupled by a snap-fit connection.

* * * * *